United States Patent
Saito et al.

(10) Patent No.: US 9,329,206 B2
(45) Date of Patent: May 3, 2016

(54) PROBE CARD AND METHOD FOR MANUFACTURING THE SAME

(71) Applicant: Kabushiki Kaisha Nihon Micronics, Tokyo (JP)

(72) Inventors: Tomokazu Saito, Aomori (JP); Yuki Kasai, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 485 days.

(21) Appl. No.: 13/672,512

(22) Filed: Nov. 8, 2012

(65) Prior Publication Data

US 2013/0120016 A1    May 16, 2013

(30) Foreign Application Priority Data

Nov. 10, 2011   (JP) ................................ 2011-246523

(51) Int. Cl.
| | |
|---|---|
| *G01R 31/00* | (2006.01) |
| *G01R 3/00* | (2006.01) |
| *H05K 3/34* | (2006.01) |
| *G01R 1/073* | (2006.01) |

(52) U.S. Cl.
CPC .. *G01R 3/00* (2013.01); *H05K 3/34* (2013.01); *G01R 1/07314* (2013.01); *H05K 2201/10318* (2013.01); *H05K 2201/10424* (2013.01); *Y10T 29/49149* (2015.01)

(58) Field of Classification Search
CPC ... H05K 3/34; H05K 2201/10318; G01R 3/00
USPC .................................................... 324/756.03
See application file for complete search history.

(56) References Cited

U.S. PATENT DOCUMENTS

| | | | |
|---|---|---|---|
| 8,851,358 B2* | 10/2014 | Saito et al. ................... | 228/256 |
| 2006/0152856 A1* | 7/2006 | Zhao et al. ................... | 360/264.2 |
| 2007/0099446 A1* | 5/2007 | Hasegawa ...................... | 439/71 |

FOREIGN PATENT DOCUMENTS

| | | |
|---|---|---|
| CN | 1487572 A | 4/2004 |
| EP | 0270067 B1 | 8/1992 |
| JP | 2000329790 A | 11/2000 |
| JP | 2002-158264 | 5/2002 |
| TW | 200946919 A | 11/2009 |
| WO | WO0118553 A1 | 3/2001 |

* cited by examiner

*Primary Examiner* — Thomas F Valone
(74) *Attorney, Agent, or Firm* — Ingrassia Fisher & Lorenz, P.C.

(57) ABSTRACT

A method for manufacturing a probe card is provided wherein probes are held in a holding plate such that the respective probes correspond to through holes with their connecting end portions projected from one surface of the holding plate. A plate-like member including openings having larger diameters than diameters of the through holes and housing the connecting end portions in the openings is arranged by making one surface of the plate-like member abut the one surface of the holding plate. After supplying solder cream in the respective openings from the other surface of the plate-like member, a connection base plate and the holding plate are relatively fixed so that the solder cream, burying the connecting end portions of the respective probes held in the holding plate with the plate-like member removed, may abut the respective corresponding connection pads, and the solder cream is heated to melt the solder cream.

3 Claims, 5 Drawing Sheets

PROBE CARD AND METHOD FOR MANUFACTURING THE SAME

RELATED APPLICATION

This application claims the benefit of, and claims priority to, Japanese patent application number 2011-246523, filed on Nov. 10, 2011.

TECHNICAL FIELD

The subject matter relates to a probe card suitable for use in an electrical test of a semiconductor device such as a semiconductor integrated circuit and a method for manufacturing the same.

BACKGROUND

Semiconductor devices such as multiple semiconductor integrated circuit formed on a semiconductor wafer undergo an electrical test in a semiconductor wafer state to determine whether or not they are manufactured in accordance with the specification before being separated into respective chips. In this electrical test with use of the semiconductor wafer as a device under test, a probe card is used in general to connect a tester to the device under test.

This probe card includes a connection base plate and multiple probes connected to conductive paths of the connection base plate, and each probe is fixed at a base end thereof on the opposite side of a tip end on a corresponding conductive connection pad provided on the connection base plate by solder, for example (refer to Patent Literature 1, for example).

Prior to fixing of each probe on each connection pad of the connection base plate, solder cream is applied to each connection pad with used of a printing technique, for example. In a state in which the base end of the corresponding probe abuts on the solder cream on the corresponding pad, a coupling portion is heated to electrically and mechanically couple each probe with the connection base plate.

In such coupling of the probe with use of the solder, by forming an appropriate fillet by the solder between the base end of the probe and the corresponding connection pad, reliability of coupling of each probe with the connection base plate can be enhanced.

However, in the aforementioned method, in which the solder cream is applied in advance to the connection pad to which each probe is to be coupled by the printing technique, there is a tendency toward difficulty in applying as much solder cream as required for generating the appropriate fillet to each connection pad by miniaturization of connection pads along with a high density trend of an integrated circuit. Such a tendency is obvious in a probe card in which each probe is made of a thin metal wire such as a chrome wire referred to as a needle.

CITATION LIST

Patent Literature 1: Japanese National Patent Appln. Public Disclosure No. 2002-158264

SUMMARY

A probe card is provided which is excellent in solder coupling strength between a connection base plate and a probe by supplying solder sufficient to form an appropriate fillet to a coupling portion between the connection base plate of the probe card and the probe to be coupled with the connection base plate and a method for manufacturing the same is provided.

A method for manufacturing a probe card according to an embodiment includes preparing a connection base plate having a surface provided with a plurality of connection pads with which a plurality of probes are to be coupled, preparing the plurality of probes each having a connecting end portion to the connection pad, preparing a holding plate having formed therein in a plate thickness direction through holes which make the respective connecting end portions of the probes opposed to the corresponding connection pads and which hold the connecting end portions, holding the probes in the holding plate in a state in which the respective probes are arranged in the corresponding through holes and in which the connecting end portions of the respective probes project from one surface of the holding plate, arranging a plate-like member by making one surface of the plate-like member abut on the one surface of the holding plate, the plate-like member penetrated by openings, formed to correspond to the through holes and having at least equal or larger diameters to or than diameters of the through holes, and having a thicknesses sufficient to house the connecting end portions in the openings, supplying solder cream in the respective openings from the other surface of the plate-like member so as to bury the respective connecting end portions of the probes housed in the respective openings of the plate-like member, and after the supply of the solder cream, heating the solder cream for melting of the solder cream for the purpose of coupling the connecting end portions of the respective probes with the respective connection pads in a state in which the connection base plate and the holding plate are relatively fixed so that the solder cream, burying the connecting end portions of the respective probes held in the holding plate in a state in which the plate-like member has been removed, may abut on the respective corresponding connection pads of the connection base plate.

Also, another method for manufacturing a probe card according to an embodiment includes, instead of using the plate-like member arranged to abut on the holding plate, forming in the through holes of the holding plate enlarged opening portions opened to one surface of the holding plate, holding the probes in the holding plate in a state in which the respective probes are arranged in the corresponding through holes and in which the connecting end portions of the respective probes are located in the enlarged opening portions of the through holes, and supplying solder cream to the respective enlarged opening portions so as to bury the respective connecting end portions of the probes in a state in which the probes are held in the holding plate.

With the method according to the an embodiment, by supplying the solder cream to the connecting end portions of the probes in the openings of the plate-like member or the enlarged opening portions of the holding plate, the solder cream sufficient to form an appropriate fillet can be supplied between the connecting end portions of the probes and the connection pads of the connection base plate with which the connecting end portions are to be coupled. Accordingly, by solidification of the solder cream after melting, an appropriate fillet can be formed between the connecting end portions of the probes and the connection pads of the connection base plate.

The holding plate may be a ceramic plate held by the connection base plate, and the corresponding probes may be held in the through holes of the ceramic plate by a solder flux applied in the through holes of the ceramic plate.

The solder cream may be heated for melting of the solder cream with use of a heating furnace. In this case, the flux is heated as well as the solder cream for melting of the solder cream, and thus the flux can be removed.

A probe card according to an embodiment includes a connection base plate having a surface provided with a plurality of connection pads, a plurality of probes having connecting end portions to the corresponding connection pads, the connecting end portions coupled with the corresponding connection pads by solder, and a holding plate having formed therein through holes which receive the probes and abutting on the surface of the connection base plate to be held by the connection base plate, each of the through holes having an enlarged diameter portion opened to a surface opposed to the surface of the connection base plate and receiving the connecting end portion of the probe to the connection pad, wherein each of the enlarged diameter portions has formed therein a fillet by the solder coupling the connecting end portion with the corresponding connection pad.

Also, another probe card according to an embodiment includes a connection base plate having a surface provided with a plurality of connection pads, and a plurality of probes having connecting end portions to the corresponding connection pads, the connecting end portions coupled with the corresponding connection pads by solder, wherein the surface of the connection base plate is provided with recesses each having as large a diameter as sufficient to house the connection pad, the connection pads are arranged within the recesses, and each of the recesses has formed therein a fillet by the solder coupling the connecting end portion with the corresponding connection pad.

Each probe may be made of a metal wire.

The connecting end portion of each probe to the connection pad may be formed by a linear part tapered toward an end thereof.

With the manufacturing method according to an embodiment, it is possible to supply the solder sufficient to form the appropriate fillet between the connecting end portion of the probe and the connection pad of the connection base plate as described above. Accordingly, by enhancing coupling strength between the connecting end portion and the connection pad, the probe card excellent in solder coupling strength between the connection base plate and the probe can be manufactured relatively easily.

Also, with the probe card according to an embodiment, by enhancing solder coupling strength between the connection base plate and the probe, the probe card with high reliability of coupling strength between the connection base plate and the probe is provided.

BRIEF DESCRIPTION OF THE DRAWINGS

FIG. 2(a) to FIG. 2(f) are partially enlarged views schematically illustrating a manufacturing process of the probe card illustrated in FIG. 1.

FIG. 3(a) to FIG. 3(e) are partially enlarged views schematically illustrating another manufacturing process of the probe card illustrated in FIG. 1.

FIG. 4(a) to FIG. 4(d) are partially enlarged views schematically illustrating still another manufacturing process of the probe card illustrated in FIG. 1.

DETAILED DESCRIPTION

A probe card 10 is used in an electrical test of a not shown device under test such as a semiconductor wafer in which multiple semiconductor integrated circuits are formed, for example. In an example illustrated in FIG. 1, the probe card 10 includes an entirely circular wiring substrate 12, a reinforcing plate 14 reinforcing a center of the wiring substrate 12 on one surface 12a of the wiring substrate, a connection base plate 16 supported by the wiring substrate on the other surface 12b of the wiring substrate 12, and multiple probes 18 attached to the connection base plate, for example. As is conventionally known, the reinforcing plate 14 is fixed on the one surface 12a of the wiring substrate 12 by tightening tools 20 such as bolts.

Figure 1:
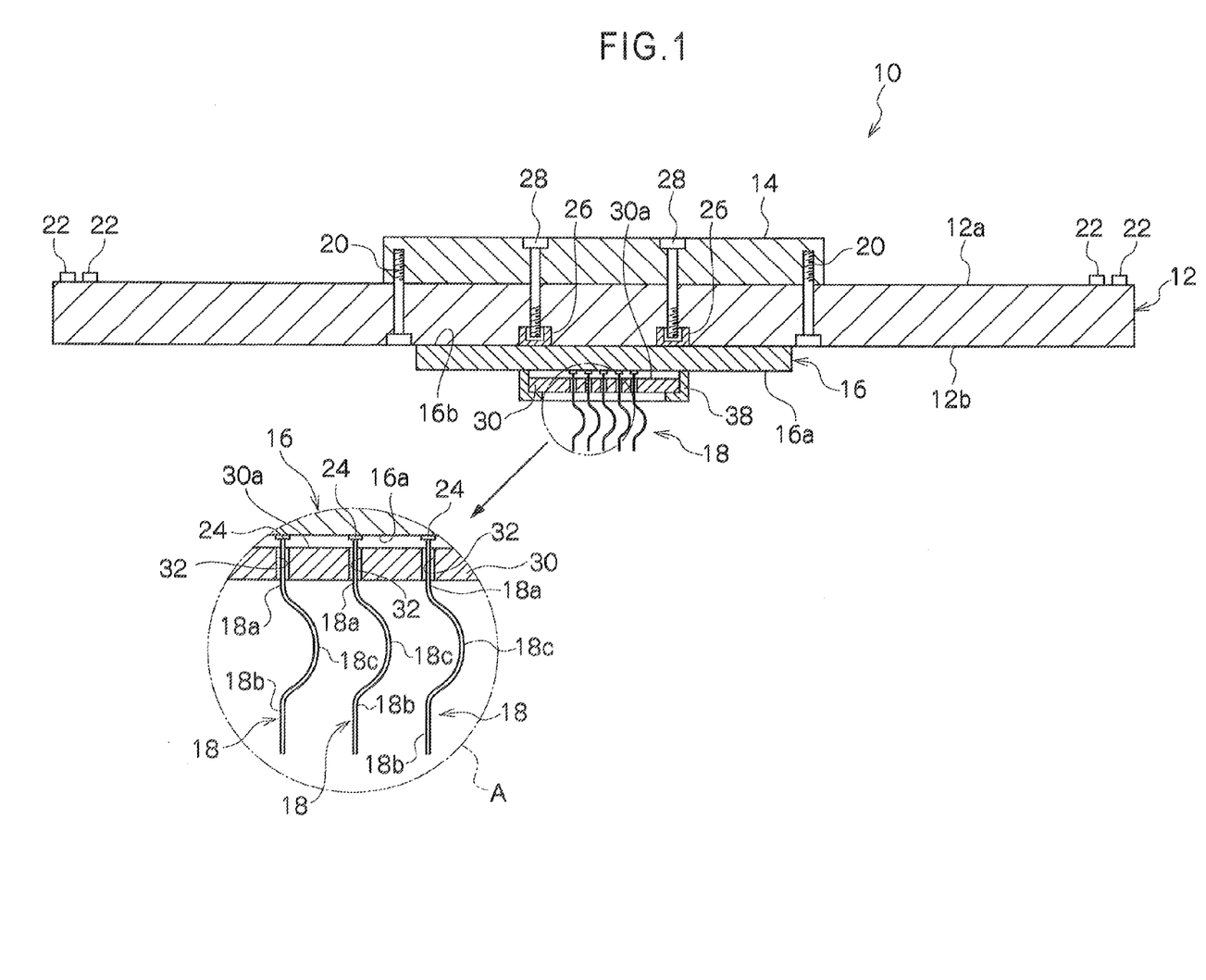
FIG. 1 is a cross-sectional view illustrating an embodiment of a probe card.

At an edge of the one surface 12a of the wiring substrate 12 are arranged multiple tester lands 22 as connecting ends to a tester (not shown) for the electrical test of the device under test. Also, at a center of the other surface 12b of the wiring substrate 12 are arranged connecting portions (not shown) corresponding to the respective tester lands 22. As is conventionally known, the connecting portions are connected to the corresponding tester lands 22 via not shown conductive paths provided in the wiring substrate 12.

The connection base plate 16 is made of a wiring substrate such as a multilayer wiring substrate. On one surface 16a of the connection base plate 16 are arranged connection pads 24 (refer to Partially enlarged view A in FIG. 1) for the respective probes 18, and on the other surface 16b thereof are arranged connecting portions (not shown) provided to correspond to the respective connection pads 24 and provided to be opposed to the aforementioned connecting portions of the wiring substrate 12. As is conventionally known, the connection pads 24 for the probes 18 and the connecting portions corresponding to the connection pads are mutually connected via conductive paths (not shown) of the connection base plate 16.

The connection base plate 16 is arranged to make the other surface 16b opposed to the other surface 12b of the wiring substrate 12 so that the connecting portions provided on the other surface 16b may be connected to the corresponding connecting portions provided on the other surface 12b of the wiring substrate 12. Bolt members 28 arranged to pass through the reinforcing plate 14 and the wiring substrate 12 are screwed at tip ends thereof in anchor portions 26 provided on the other surface 16b of the connection base plate 16 to cause the connection base plate 16 to be supported on the other surface 12b of the wiring substrate 12 at a predetermined position.

Each probe 18 is a so-to-speak vertical probe made of a metal wire such as a tungsten wire or a metal wire such as a nickel alloy made by MEMS in an example illustrated in the figure. Each probe 18 includes a pair of linear portions 18a and 18b arrayed linearly to be spaced from each other and a curved portion 18c between both the linear portions as illustrated in Partially enlarged view A in FIG. 1. One linear portion 18a is arranged to pass through a holding plate 30 such as a ceramic plate.

In the holding plate 30 are formed through holes 32 that allow the one linear portions 18a of the probes 18 to pass therethrough to extend in a plate thickness direction of the holding plate 30 to correspond to an arrangement pitch of the probes 18, that is an arrangement pitch of the connection pads 24 of the connection base plate 16. An end of the one linear portion 18a of each probe 18 passes through the corresponding through hole 32 and projects from one surface 30a of the holding plate 30 toward the corresponding connection pad 24.

Figure 2:
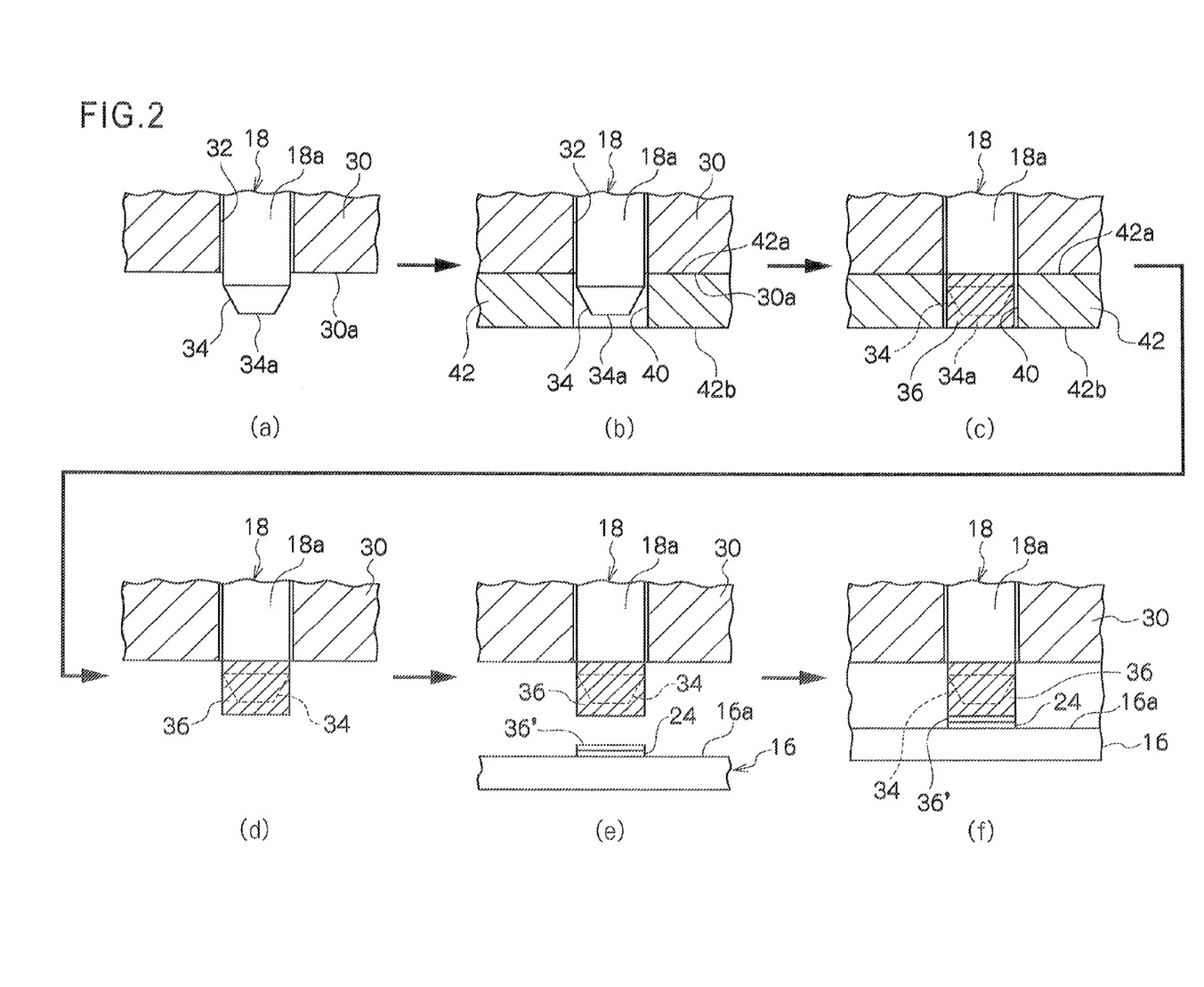

As illustrated in FIG. 2(f), which is referred to in description of a coupling process between each probe 18 and the connection base plate 16 described later in details, an end part 34 of the linear portion 18a projecting from the one surface 30a of the holding plate 30 is coupled with the corresponding connection pad 24 via solder 36. Accordingly, the end part 34 of the one linear portion 18a projecting from the one surface 30a of the holding plate 30 opposed to the one surface 16a of the connection base plate 16 is a connecting end portion (34) to the connection pad 24.

As is conventionally known, the holding plate 30 is supported at a predetermined position to the connection base plate 16 by an annular holding member 38 held on the one surface 16a of the wiring substrate 16 to receive an outer edge of the holding plate 30 for the purpose of holding each probe 18 at the one linear portion 18a.

The probe card 10 is aligned with the device under test so that an end of the other linear portion 18b of each probe 18 held in the holding plate 30 may be connected to an electrode of the device under test as a probe tip. At this time, when relative displacement in a mutually-approaching direction is provided between the probe card 10 and the device under test, the curved portion 18c of each probe 18 gives the probe tip, which is the end of the other linear portion 18b of the probe 18, elastic displacement along the linear portion 18b by elastic deformation of the curved portion 18c. This elastic displacement of each probe tip enables the probe tips of all the probes 18 to be electrically connected to the corresponding electrodes reliably regardless of variation of height positions of the probe tips of the respective probes 18 due to a manufacturing error. As a result, the electrodes of the device under test are electrically connected to the corresponding probes 18 and the tester via the tester lands 22 electrically connected to the probes 18 for the electrical test of the device under test.

Next, referring to FIG. 2(a) to FIG. 4(d), operating processes of coupling the connecting end of each probe 18 with the corresponding connection pad 24 of the connection base plate 16 will be described. In FIG. 2(a) to FIG. 4(d), postures of the probe 18, the holding plate 30, and the wiring substrate 12 illustrated in FIG. 1 are shown to be reversed in an up-down direction.

As illustrated in FIG. 2(a), each probe 18 is inserted in the corresponding through hole 32 of the holding plate 30 so that the one linear portion 18a of the probe 18 may project from the one surface 30a of the holding plate 30 by a predetermined amount. In an example illustrated in FIGS. 2(a) to 2(f), the end part or the connecting end portion 34 of the linear portion 18a projecting from the one surface 30a of the holding plate 30 constitutes a tapered portion and ends with a flat surface 34a.

In a state in which the respective probes 18 are aligned so that the projecting amounts of the connecting end portions 34 of the respective probes 18 from the holding plate 30 may be equal, a temporary fixing means (not shown) such as a soldering flux is applied between the linear portions 18a of the respective probes 18 and the through holes 32, for example. As such a temporary fixing means, frictional engagement between the one linear portions 18a and inner circumferential walls of the through holes 32 can be utilized.

In a state in which each probe 18 is held in the corresponding through hole 32 of the holding plate 30 by the temporary fixing means, a plate-like member 42 having an opening 40 corresponding to each through hole 32 is applied to the one surface 30a of the holding plate 30, as illustrated in FIG. 2(b).

The plate-like member 42 is made of a polyimide synthetic film having a thickness dimension of, e.g., 50 to 100 μm. The opening 40 penetrates the plate-like member 42 from one surface 42a to the other surface 42b of the plate-like member 42 and has an approximately equal diameter to a diameter of the through hole 32. The plate-like member 42 has a thickness dimension in which, when the plate-like member 42 is arranged to make the one surface 42a abut on the one surface 30a of the holding plate 30 so that the opening 40 may correspond to the through hole 32, the flat surface 34a of the end part 34 of the probe 18 is located in the opening 40 or between both the surfaces 42a and 42b of the plate-like member 42.

In a state in which the plate-like member 42 is attached to the holding plate 30 with use of a viscosity agent such as a soldering flux as illustrated in FIG. 2(b), the opening 40 is filled with the solder cream 36 from the other surface 42b of the plate-like member 42 with use of, e.g., a squeegee. By the filling with the solder cream 36, the connecting end portion 34 of each probe 18 is buried in the solder cream 36, and thus it is possible to apply as much solder cream 36 as required for forming a soldering fillet to each connecting end portion 34.

As illustrated in FIG. 2(d), in a state in which the solder cream 36 remains at the connecting end portion 34 so as to bury the connecting end portion 34, the plate-like member 42 is separated from the holding plate so that the one surface 42a of the plate-like member 42 may be removed from the one surface 30a of the holding plate 30.

In a state in which the plate-like member 42 is separated from the holding plate 30, the solder cream 36 applied to the connecting end portion 34 of each probe 18 abuts on the corresponding connection pad 24 on the one surface 16a of the connection base plate 16. Prior to this, as illustrated in FIG. 2(e), solder cream 36' can be applied to the connection pad 24 of the connection base plate 16 by a similar printing technique to a conventional one. Although the application of the solder cream 36' to the connection pad 24 can be dispensed, the application of the solder cream 36' can contribute to an additional increase in application amount of the solder cream.

In this case, the holding plate 30 is coupled with the connection base plate 16 by a temporary fixing means or the holding member 38 so that the solder cream 36 on the connecting end portion 34 of each probe 18 may abut on the solder cream 36' on each connection pad 24 of the connection base plate 16. In a case where the solder cream 36' is not applied to the connection pad 24, the holding plate 30 is coupled with the connection base plate 16 so that the solder cream 36 on the connecting end portion 34 may abut on the connection pad 24.

A coupling body of the connection base plate 16 and the holding plate 30 including the probes 18 undergoes a heating treatment in, e.g., a heating furnace. In this heating treatment, both the solder cream 36 and 36' is melted, and by solidification thereof, the connecting end portion 34 of each probe 18 is coupled with the corresponding connection pad 24 on the connection base plate 16 as illustrated in FIG. 2(f).

In solidification of the solder cream 36 or the solder cream 36 and 36' after the heating treatment, since as much solder cream 36 as required for forming the soldering fillet is applied to the connecting end portion 34 of each probe 18 in advance with use of the plate-like member 42, the appropriate solder fillet is formed between the connecting end portion and the connection pad 24.

Accordingly, coupling strength between the connecting end portion 34 of each probe 18 and the connection pad 24 can be enhanced, and the probe card 10 excellent in solder coupling strength between the connection base plate 16 and each probe 18 can be manufactured relatively easily.

Also, even in a case where slight variation in height positions of the flat surfaces 34a is generated in the aforementioned temporary fixing of the respective probes 18 to the holding plate 30, as much molten solder as sufficient in absorbing variation among distances between the connecting end portions 34 and the connection pad 24 at the time of the heating treatment can be provided inbetween. Accordingly, reliable and stable coupling can be obtained between each probe 18 and the corresponding connection pad 24.

In the foregoing description, an example in which the diameter of each opening 40 in the plate-like member 42 is set to be approximately equal to that of each through hole 32 in the holding plate 30 has been illustrated. However, the diameter of the opening 40 can be set to be larger than that of the through hole 32 in order to apply a required amount of solder cream 36 to each connecting end portion 34 as long as the adjacent openings 40 in the plate-like member 42 do not interfere with each other. Also, the plate-like member 42 having a longer thickness dimension can be used in accordance with a required amount of the solder cream 36. Further, after the solder cream 36 is applied in each opening 40 in the plate-like member 42, the plate-like member 42 can be coupled with the holding plate 30 integrally without being removed from the holding plate 30.

FIGS. 3(a) to 3(e) illustrate a method for applying as much solder cream as required for forming the soldering fillet to the connecting end portion 34 of each probe 18 without using the plate-like member 42 illustrated in FIGS. 2(a) to 2(f).

Figure 3:
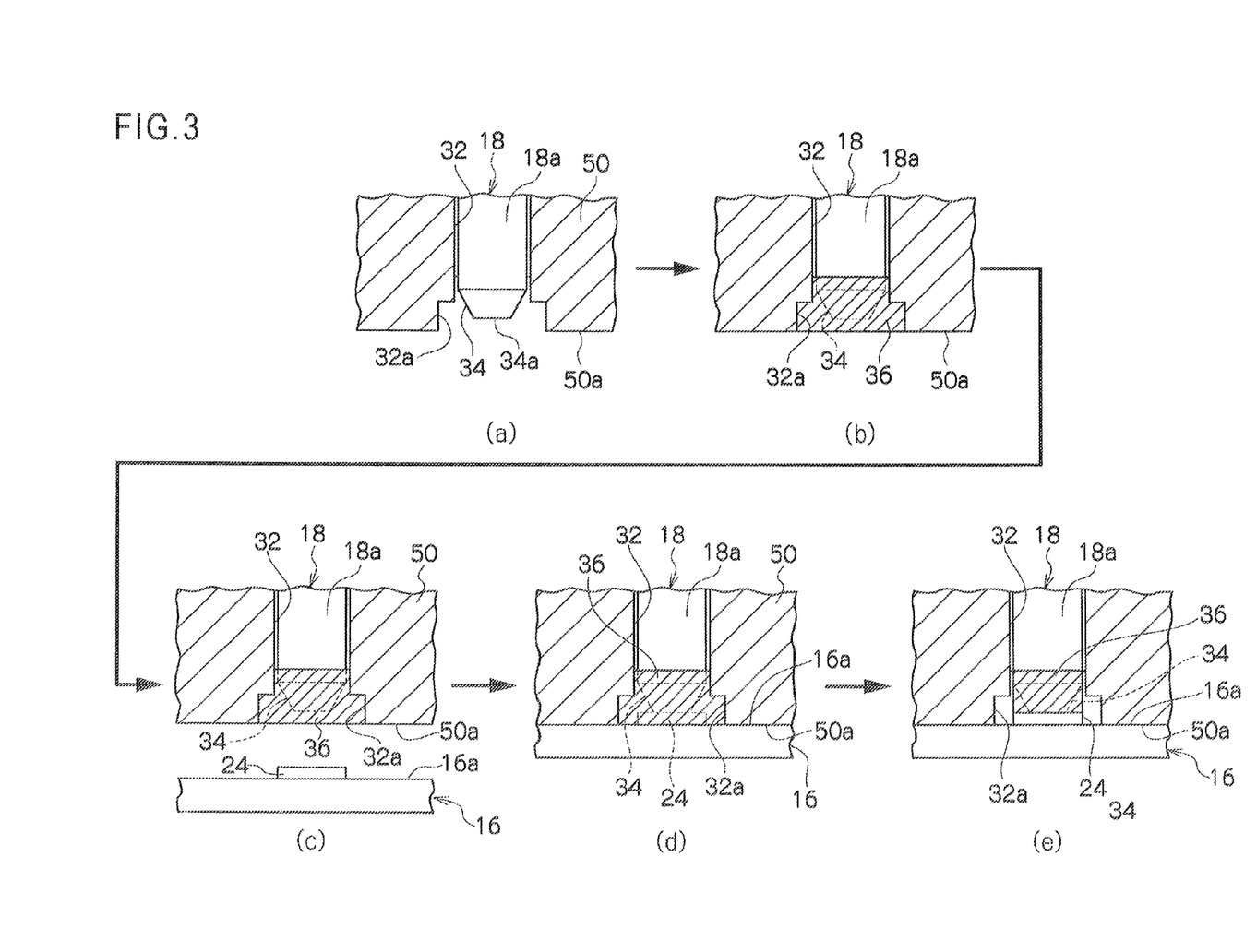
Figure 4:
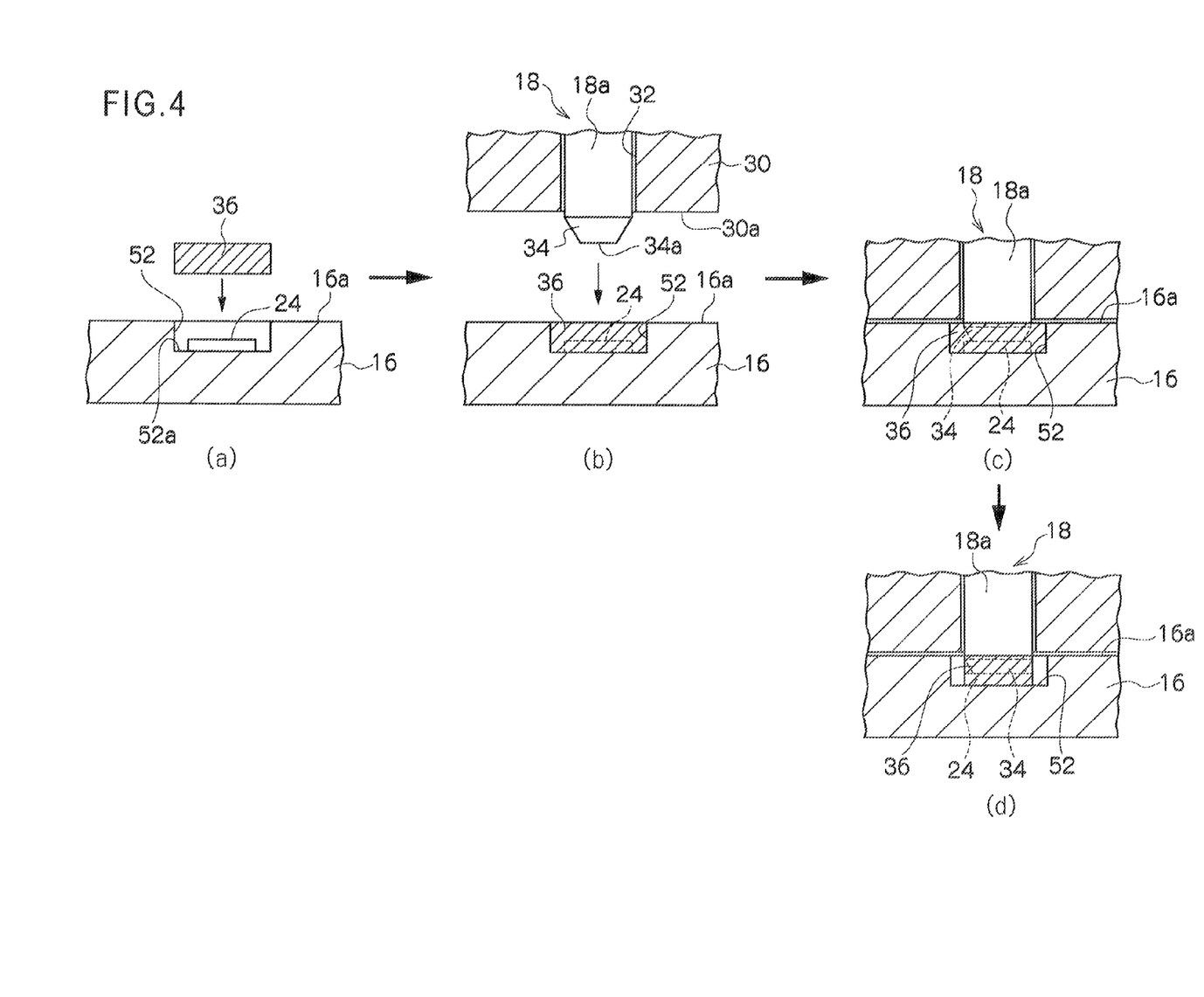

As illustrated in FIG. 3(a), a holding plate 50 having the through holes 32 similar to one described above is prepared. A difference between the holding plate 30 illustrated in FIGS. 2(a) to 2(f) and the holding plate 50 illustrated in FIGS. 3(a) to 3(e) is a respect in which each through hole 32 of the holding plate 50 has an enlarged diameter portion 32a of the through hole 32 on one surface 50a opposed to the connection base plate 16. Each probe 18 is inserted in the corresponding through hole 32 and is held to the holding plate 50 by a temporary fixing means similar to one described above so that the flat surface 34a of the connecting end portion 34 of the probe 18 may be located in this enlarged diameter portion 32a.

In a state in which the probe 18 is held to the holding plate 50, at least the enlarged diameter portion 32a of the through hole 32 is filled with the solder cream 36 from the one surface 50a of the holding plate 50 as illustrated in FIG. 3(b). By the filling with the solder cream 36, the connecting end portion 34 of each probe 18 is buried in the solder cream 36, and thus it is possible to apply as much solder cream 36 as required for forming the soldering fillet to each connecting end portion 34 in a similar manner to that described in the first example.

In a state in which the solder cream 36 has been applied to the connecting end portion 34 as illustrated in FIG. 3(c), the holding plate 50 is coupled with the connection base plate 16 by the aforementioned temporary fixing means or the holding member 38 at a position at which the connecting end portion 34 corresponds to the connection pad 24 so that the one surface 50a of the holding plate 50 may abut on the one surface 16a of the connection base plate 16 as illustrated in FIG. 3(d). At this time, in an example illustrated in FIG. 3(d), the flat surface 34a of the connecting end portion 34 abuts on the corresponding connection pad 24.

A coupling body of the connection base plate 16 and the holding plate 50 including the probes 18 undergoes a heating treatment similar to one described above. By doing so, by melting and subsequent solidification of the solder cream 36, the connecting end portion 34 of each probe 18 is coupled with the corresponding connection pad 24 on the connection base plate 16 as illustrated in FIG. 3(e).

In the second example as well as in the first example, the solder cream can be applied on each connection pad 24 of the connection base plate 16.

As illustrated in FIGS. 4(a) to 4(d), a sufficient amount of solder cream can be supplied to each connection pad 24 of the connection base plate 16.

As illustrated in FIG. 4(a), a recess 52 can be formed on the one surface 16a of the connection base plate 16 opposed to the holding plate 30. On a bottom surface 52a of the recess 52 is formed the connection pad 24 similar to one described above, and the connection pad 24 is housed in the recess.

The solder cream 36 is applied in the recess 52 with use of, e.g., a squeegee to bury the connection pad 24 in the solder cream. As illustrated in FIG. 4(b), each probe 18 is held in the holding plate 30 in a state in which the probe 18 is inserted in the through hole 32 of the holding plate 30 so that the connecting end portion 34 of the probe 18 may project from the one surface 30a of the holding plate 30. As illustrated in FIG. 4(c), the holding plate 30 is coupled with the connection base plate 16 by the aforementioned temporary fixing means or the holding member 38 so that the connecting end portion 34 of the probe 18 may abut on the corresponding connection pad 24 buried in the solder cream 36.

A coupling body of the connection base plate 16 and the holding plate 30 including the probes 18 undergoes a heating treatment similar to one described above. By doing so, by melting and subsequent solidification of the solder cream 36, the connecting end portion 34 of each probe 18 is coupled with the corresponding connection pad 24 on the connection base plate 16 as illustrated in FIG. 4(d).

A depth dimension of the recess 52 can be set arbitrarily to cause an appropriate amount of solder cream 36 to be held in the recess 52. Also, the diameter of the recess 52 can be increased in accordance with a required amount of solder cream 36 as long as the adjacent recesses 52 do not interfere with each other.

Figure 5:
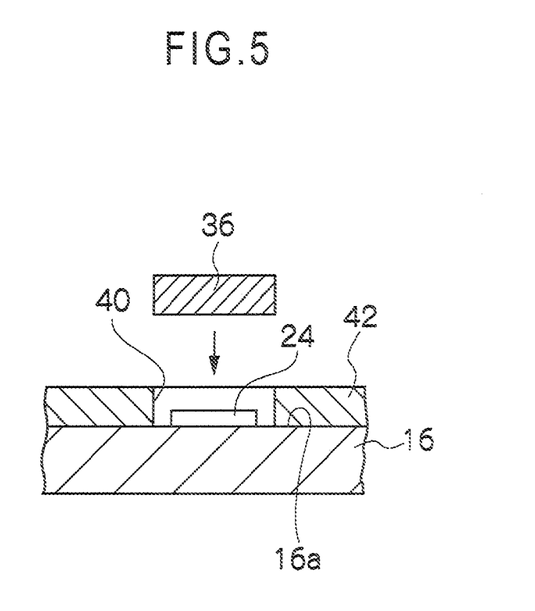
FIG. 5 is a partially enlarged view schematically illustrating one step in another manufacturing process of the probe card illustrated in FIG. 4.

In the example illustrated in FIGS. 4(a) to 4(d), the recess 52 has been formed in the connection base plate 16. However, instead of this, by applying the plate-like member 42 made of, e.g., a polyimide synthetic film having the opening 40 to the connection base plate 16 provided on the one surface 16a, which is flat, with the connection pad 24, a recess similar to one described above can be formed by the opening 40, as illustrated in FIG. 5. In this case, the plate-like member 42 is fixed to the connection base plate 16 without being removed from the connection base plate 16 and can be part of the connection base plate 16.

The described subject matter is not limited to the above embodiments but may be altered in various ways without departing from the spirit and scope presented here. For example, to the probe, not only the aforementioned metal wire but also one of various types whose connecting end portion to the connection base plate is formed in a linear shape can be applied.

Also, in the foregoing description, an example in which the solder cream is applied to the connecting end portion of the probe in advance has been illustrated in relation to FIGS. 2(a) to 2(f) and FIGS. 3(a) to 3(e), and an example in which the solder cream is applied to the connection pad in advance has been illustrated in relation to FIGS. 4(a) to 4(d). However, the solder cream can be applied in advance as described above to both the connecting end portion of the probe and the connection pad with which the connecting end portion is to be coupled.

What is claimed is:

1. A method for manufacturing a probe card, comprising:
preparing a connection base plate having a surface provided with a plurality of connection pads with which a plurality of probes are to be coupled;
preparing the plurality of probes each having a connecting end portion to the connection pad;
preparing a holding plate having formed therein in a plate thickness direction through holes which make the respective connecting end portions of the probes opposed to the corresponding connection pads and which hold the connecting end portions;
holding the probes in the holding plate in a state in which the respective probes are arranged in the corresponding through holes and in which the connecting end portions of the respective probes project from one surface of the holding plate;
arranging a plate-like member by making one surface of the plate-like member abut on the one surface of the holding plate, the plate-like member penetrated by openings, formed to correspond to the through holes and having at least equal or larger diameters to or than diameters of the through holes, and having a thickness sufficient to house the connecting end portions in the openings;
supplying solder cream in the respective openings from the other surface of the plate-like member so as to bury the respective connecting end portions of the probes housed in the respective openings of the plate-like member; and
after the supply of the solder cream, heating the solder cream for melting of the solder cream for the purpose of coupling the connecting end portions of the respective probes with the respective connection pads in a state in which the connection base plate and the holding plate are relatively fixed so that the solder cream, burying the connecting end portions of the respective probes held in the holding plate in a state in which the plate-like member has been removed, may abut on the respective corresponding connection pads of the connection base plate.

2. The method according to claim 1, wherein the holding plate is a ceramic plate held by the connection base plate, and the corresponding probes are held in the through holes of the ceramic plate by a flux applied in the through holes of the ceramic plate.

3. The method according to claim 2, wherein the solder cream is heated for melting of the solder cream with use of a heating furnace.

* * * * *